United States Patent [19]
Okuda et al.

[11] Patent Number: 5,577,610
[45] Date of Patent: Nov. 26, 1996

[54] CASING FOR FRAME-SUPPORTED PELLICLES

[75] Inventors: Kazuya Okuda, Itoigawa; Satoshi Kawakami, Annaka, both of Japan

[73] Assignees: Shin-Etsu Polymer Co., Ltd.; Shin-Etsu Chemical Co., Ltd., both of Tokyo, Japan

[21] Appl. No.: 533,784

[22] Filed: Sep. 26, 1995

[30] Foreign Application Priority Data

Oct. 12, 1994 [JP] Japan ................................. 6-245823

[51] Int. Cl.$^6$ .................................................. B65D 81/18
[52] U.S. Cl. .......................... 206/454; 206/316.1; 206/719
[58] Field of Search ........................ 206/710–712, 206/719–721, 724, 316.1, 454–456; 428/35.7, 76

[56] References Cited

U.S. PATENT DOCUMENTS

| | | | |
|---|---|---|---|
| 4,470,508 | 9/1984 | Yen | 206/454 |
| 4,511,038 | 4/1985 | Miller et al. | 206/454 |
| 4,697,701 | 10/1987 | Ying | 206/316.1 |
| 5,042,655 | 8/1991 | Beldyk et al. | 206/454 |
| 5,168,993 | 12/1992 | Yen | 206/724 |
| 5,305,878 | 4/1994 | Yen | 206/455 |
| 5,330,053 | 7/1994 | Tabuchi et al. | 206/455 |
| 5,353,934 | 10/1994 | Yamauchi | 206/454 |
| 5,399,398 | 3/1995 | Toshimitsu et al. | 206/719 |

FOREIGN PATENT DOCUMENTS 6-208221  7/1994  Japan ....................... 206/455

*Primary Examiner*—Jimmy G. Foster
*Attorney, Agent, or Firm*—David E. Dougherty

[57] ABSTRACT

Proposed is a novel casing for frame-supported pellicle used for dustproof protection of a photomask in the photolithographic patterning process for the manufacture of fine electronic devices. Different from conventional casings made from a plastic resin, the casing of the invention is characterized by the use of a unique permanently antistatic resin composition which is a resin blend consisting of 80–95% by weight of an ABS or acrylic resin and 20–5% by weight of a specific hydrophilic polymer. By virtue of the excellent antistatic behavior of the resin composition, the frame-supported pellicle encased in the casing is safe from the troubles due to deposition of dust particles during transportation and from contamination by the vaporized matter from the casing.

3 Claims, 1 Drawing Sheet

CASING FOR FRAME-SUPPORTED PELLICLES

BACKGROUND OF THE INVENTION

The present invention relates to a casing for a frame-supported pellicle which is a device used for the protection of a photomask or reticle during a photolithographic patterning procedure in the manufacture of various kinds of fine electronic devices such as ICs, LSIs, liquid-crystal display panels and the like by preventing falling and deposition of dust particles thereon.

As is well known, most of the manufacturing processes of fine electronic devices such as ICs, LSIs, liquid-crystal display panels and the like involve a photolithographic patterning work in which a photoresist layer formed on the surface of a substrate such as a semiconductor silicon wafer is patternwise exposed to ultraviolet light through a transparency called a photomask bearing a pattern to be reproduced in the photoresist layer. In view of the extreme fineness of the pattern to be reproduced, it is very important that the photomask is absolutely free from dust particles deposited thereon because deposition of any smallest number of dust particles on the photomask may cause serious degradation in the quality of pattern reproduction due to scattering of light by the dust particles.

Because an absolutely dust-free condition can never be accomplished even in a clean room of the highest class, it is a usual procedure that the photomask is protected against falling dust particles by mounting thereon a frame-supported pellicle which is an integral device consisting of a rigid frame of aluminum and the like, referred to as a pellicle frame hereinafter, and a highly transparent thin film of a plastic resin, referred to as a pellicle membrane hereinafter, spread over and adhesively bonded to one end surface of the pellicle frame in a slack-free fashion. Since the pellicle membrane is above the photomask by the height of the pellicle frame when the frame-supported pellicle is mounted on a photomask, dust particles deposited on the pellicle membrane have no particular adverse influences on the quality of pattern reproduction by the ultraviolet light focused on the photomask. Needless to say, nevertheless, it is very important that a frame-supported pellicle is kept as dust-free as possible insofar as it is used for the dustproof protection. Therefore, it is usual that a frame-supported pellicle is encased in an air-tight casing during storage and transportation in order to prevent deposition of dust particles thereon.

Among the various types of casings proposed heretofore and under practical use, FIGS. 1 and 2 illustrate a typical casing by a plan view and by a vertical cross sectional view, respectively, consisting of a body of casing 10 and a covering 20 encasing a frame-supported rectangular pellicle consisting of a pellicle frame 31 and a pellicle membrane 30 spread over and adhesively bonded to the upper end surface of the pellicle frame 31 in a slack-free fashion. The body of the casing 10 is provided along the periphery with an upwardly protruded rib 11 for the purpose of engagement with the covering 20 and the center area 12 of the body 10 is raised in the form of a rectangular stage to be wide enough for mounting the pellicle frame 31 forming a recess 12a on the lower surface of the body 10. Surrounding the area 12 for mounting of the pellicle frame 31, a plural number of pin protrusions 13 are integrally formed to provide a means for engagement of the pellicle frame 31. Though not essential, a plural number of supporting legs 19 are formed on the lower surface of the casing body 10.

On the other hand, the covering 20 has the periphery upwardly bent to form a U-shaped turning 21 which comes into elastic engagement with the rib 11 around the casing body 10 when the covering 20 is mounted on the casing body 10. Further, stepwise zone 22 surrounding the center area of the covering 20 serves as a presser for the frame-supported pellicle mounted on the mounting stage 12 surrounded by the pin protrusions 13 by coming into contact with the upper end of the pellicle frame 31.

While the above mentioned casing body 10 and the covering 20 of the casing for a frame-supported pellicle are made usually from a plastic resin, it is important that the surface of the casing body and covering per se is also antistatic in order to prevent dust particle deposition thereon due to electrostatic attraction because dust particles deposited thereon may eventually migrate on to the frame-supported pellicle encased in the casing during transportation to cause troubles. As is well known, the surface of a plastic resin-made body can be rendered antistatic either by compounding the plastic resin with an antistatic agent such as surface active agents or by coating the surface with a coating composition containing an antistatic agent. These prior art methods are not always quite satisfactory because the antistatic nature of the surface can be readily lost when the body is rinsed with water or cleaned by using a cloth. When the casing is shaped from a plastic resin composition containing a surface active agent, moreover, it is sometimes the case in the lapse of time that the surface active agent contained in the plastic resin composition bleeds on the surface of the casing to cause contamination of the frame-supported pellicle encased in the casing. As a means to ensure semi-permanency of the antistatic performance in a plastic resin composition without the above mentioned problems, proposals have been made for a method in which the plastic resin is compounded with a particulate electroconductive material such as carbon black. While effective to obtain surface conductivity of a plastic resin body, however, this method has a contrary effect in respect of dust particle occurrence because dust particles are eventually produced from the carbon black incorporated into the plastic resin in such a large amount as to ensure electroconductivity of the body shaped from the resin composition.

SUMMARY OF THE INVENTION

The present invention accordingly has an object to provide a casing for a frame-supported pellicle used for dustproof protection of a photomask in the photolithographic patterning works without the above described problems and disadvantages in the conventional casings for the same purpose.

Thus, the casing for a frame-supported pellicle provided by the present invention is an assembly which comprises:

(a) a casing body capable of mounting a frame-supported pellicle on the center area; and (b) a covering mountable on and engageable with the casing body in the periphery, each of the casing body and the covering being shaped from an antistatic resin composition which is a resin blend consisting of from 80 to 95% by weight of an ABS resin or an acrylic resin as the matrix phase and from 20 to 5% by weight of a hydrophilic resin dispersed in the matrix phase.

The above mentioned hydrophilic resin forming the dispersed phase is selected from the group consisting of copolymers of polyethyleneglycol methacrylates, poly(ethylene oxide-propylene oxide) copolymers, polyethyleneglycol-based polyamides and poly(epichlorohydrin-ethylene oxide) copolymers.

DETAILED DESCRIPTION OF THE PREFERRED EMBODIMENTS

Figure 1:
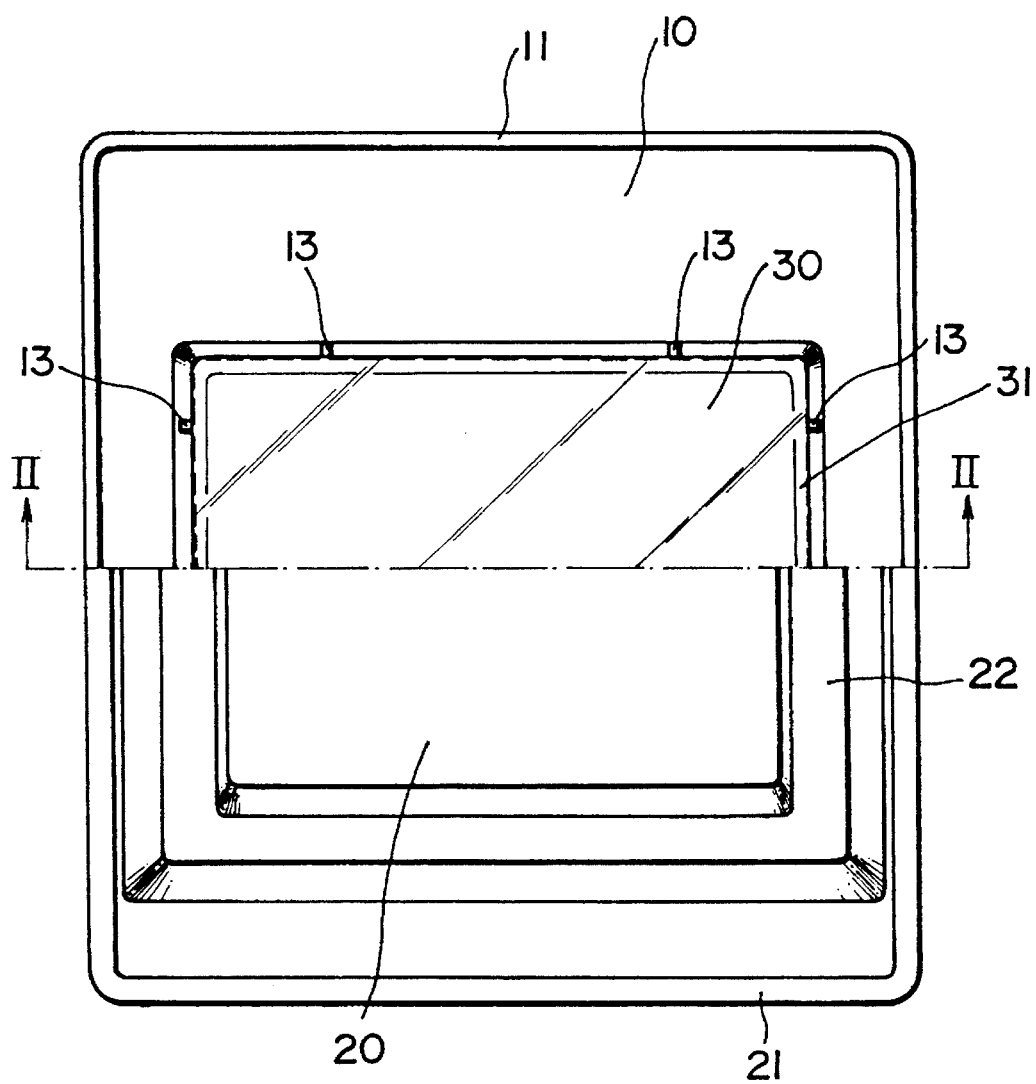
FIG. 1 is a plan view of the casing containing a frame-supported pellicle, the covering being removed in the upper half as cut.
Figure 2:
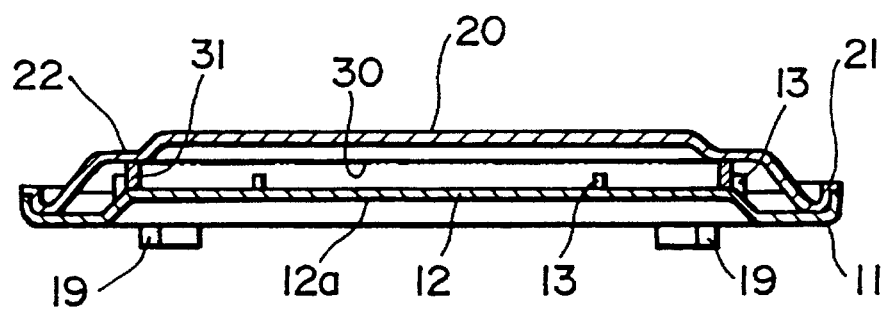
FIG. 2 is a vertical cross sectional view of the casing containing a frame-supported pellicle as cut and viewed along the arrows II—II in FIG. 1.

As is understood from the above given summarizing description, the most characteristic feature in the inventive casing for a frame-supported pellicle consists in the use of a very specific polymeric resin composition as the material of the casing body and covering. Namely, the resin composition from which the casing body and covering of the inventive casing are shaped, is a resin blend consisting of from 80 to 95% by weight of an ABS resin or an acrylic resin as the matrix phase and from 20 to 5% by weight of a hydrophilic resin dispersed in the matrix phase.

While a great variety of hydrophilic polymers are known in the art of polymeric materials, it has been unexpectedly discovered that the antistatic effect desired for a casing of a frame-supported pellicle can be obtained when and only when the hydrophilic resin forming the dispersed phase is selected from the group consisting of copolymers of polyethyleneglycol methacrylates, poly(ethylene oxide-propylene oxide) copolymers, polyethyleneglycol-based polyamides and poly(epichlorohydrin-ethylene oxide) copolymers, in particular, as combined with an ABS resin or an acrylic resin as the matrix phase. When the antistatic resin composition is formed from a combination of these specific matrix and dispersant resins, the body shaped from the resin composition is imparted with semi-permanently lasting antistatic effect. Moreover, the antistatic casing is advantageous, as compared with antistatic resin compositions by compounding with a surface active agent, in respect of the absence of the undesirable phenomenon of bleeding of the oily constituent on the surface and, as compared with those by compounding with a large amount of carbon black, in respect of absence of the undesirable phenomenon of falling of a particulate matter. While it is a requirement in a casing for a frame-supported pellicle that the surface resistivity of the body is within the range from $1\times10^{10}$ to $1\times10^{12}$ ohm, such a surface resistivity can readily be obtained by suitably compounding the above mentioned two kinds of the component resins in a compounding proportion within the above mentioned range with consideration of other properties of the resin composition. In particular, the matrix resin is preferably an acrylic resin because a resin composition based on an acrylic resin retains transparency to some extent when the compounding amount of the dispersed phase is relatively small to ensure see-through visibility of the objective contained in the casing.

In the following, the advantages of the inventive casing are described in more detail by way of examples and comparative examples.

EXAMPLE

A body of casing for frame-supported pellicles was prepared by injection molding from an antistatic resin composition consisting of 80% by weight of an ABS resin as the matrix and 20% by weight of a polyethyleneglycol-based polyamide copolymer as the dispersed phase (ADION-A, a product by Asahi Chemical Industry Co.). The resin composition used here was of the black-colored grade in consideration of easiness of detection of any fine dust particles deposited on the surface. The thus injection-molded article had a surface resistivity of $3\times10^{11}$ ohm at 23° C. under 50% relative humidity.

A covering of the casing to fit the above described body of the casing was prepared by injection molding from another antistatic resin composition consisting of 80% by weight of a polymethyl methacrylate resin as the matrix and 20% by weight of a polyethyleneglycol methacrylate copolymer as the dispersed phase (BAY-ON, a product by Kureha Chemical Industry Co.). The thus injection-molded article had a surface resistivity of $5\times10^{11}$ ohm at 23° C. under 55% relative humidity. This covering had transparency sufficient to ensure see-through visibility of the frame-supported pellicle contained in the casing.

The casing consisting of the above described body and covering was evaluated in two ways for the occurrence of dust particles by vibration and for the possibility of contamination of the pellicle membrane by absorption of any vaporizable matter, such as the low molecular-weight molecules of the polymer, from the body and covering of the casing by acceleration at an elevated temperature as described below.

Thus, the casing containing a frame-supported pellicle was subjected to a vibration test in the up and down direction on a vibrator at a frequency of 200 vibrations per minute with an amplitude of 50 mm for 3 hours. The frame-supported pellicle taken out of the casing was inspected under a spotlight for any dust particles deposited on the pellicle membrane to detect none.

Further, the casing containing a frame-supported pellicle was kept standing at 60° C. for 10 days and the frame-supported pellicle taken out of the casing was subjected to the measurement of the light transmission of the pellicle membrane at a wavelength of 248 nm to find that the transmission was 99.3% without decrease as compared with the value before this acceleration test.

COMPARATIVE EXAMPLE

The experimental procedure was substantially the same as in the Example described above except that the body of the casing was shaped from an antistatic ABS resin composition consisting of an ABS resin and a surface active agent compounded with the ABS resin (Toyolac ABS-500, a product by Toray Corp.) and the covering was shaped from an antistatic acrylic resin consisting of an acrylic resin and a surface active agent compounded with the acrylic resin (Colcote 515, a product by Colcote Co.). The body and covering of the casing had surface resistivities of $2\times10^{13}$ ohm and $7\times10^{13}$ ohm, respectively, to be higher than the desirable value of $1\times10^{10}$ ohm to $1\times10^{12}$ ohm. The see-through visibility of the frame-supported pellicle contained in the casing was good through the covering.

The comparative casing consisting of the above described body and covering was subjected to the same evaluation tests as in the Example to find that at least three dust particles were detected on the pellicle membrane of 6 inches diameter after the vibration test and the ultraviolet transmission was dropped from 99.3% to 98.4% after the accelerated storage test at 60° C.

For further comparison, another casing was prepared from a carbon black-loaded antistatic resin composition to find that the surface resistivity of the molded articles widely varied from spot to spot in the range from $1\times10^5$ ohm to $1\times10^{14}$ ohm. Needless to say, the covering was not transparent to inhibit recognition of the frame-supported pellicle contained in the casing.

What is claimed is:

1. A casing for a frame-supported pellicle which comprises, as an assembly:
   (a) a casing body including central and peripheral areas, and a frame-supported pellicle mounted on said body with the pellicle over said central area; and
   (b) a covering mounted on said casing body with said pellicle over said central area; and each of the casing body and the covering being shaped from an anti-static resin composition which is a resin blend consisting of from 80 to 95% by weight of an ABS resin or an acrylic resin as the matrix phase and from 20 to 5% by weight of a hydrophilic resin dispersed in the matrix phase.

2. The casing for a frame-supported pellicle as claimed in claim 1 in which the hydrophilic resin forming the dispersed phase is selected from the group consisting of copolymers of polyethyleneglycol methacrylates, poly(ethylene oxide-propylene oxide) copolymers, polyethyleneglycol-based polyamides and poly(epichlorohydrin-ethylene oxide) copolymers.

3. The casing for a frame-supported pellicle as claimed in claim 1 in which each of the casing body and the covering has a surface resistivity not exceeding $1\times10^{12}$ ohm.

* * * * *